United States Patent
Chiou et al.

(10) Patent No.: US 8,673,775 B2
(45) Date of Patent: Mar. 18, 2014

(54) METHODS OF FORMING SEMICONDUCTOR STRUCTURES

(71) Applicant: Taiwan Semiconductor Manufacturing Company, Ltd., Hsinchu (TW)

(72) Inventors: Wen-Chih Chiou, Miaoli (TW); Tsang-Jiuh Wu, Hsinchu (TW); Ku-Feng Yang, Dali (TW); Hsin-Yu Chen, Taipei (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 13/905,302

(22) Filed: May 30, 2013

(65) Prior Publication Data

US 2013/0252422 A1    Sep. 26, 2013

Related U.S. Application Data

(62) Division of application No. 13/161,153, filed on Jun. 15, 2011.

(51) Int. Cl.
    *H01L 21/44* (2006.01)

(52) U.S. Cl.
    USPC .... 438/667; 438/622; 438/637; 257/E21.585; 257/774

(58) Field of Classification Search
    USPC .......... 257/E25.017, 686, 705, 723, 724, 750, 257/758, 760, 773, 774, 777, 786, E21.577, 257/E21.585; 438/597, 622, 637, 638, 667, 438/699, 702
    See application file for complete search history.

(56) References Cited

U.S. PATENT DOCUMENTS

| | | |
|---|---|---|
| 3,761,782 A | 9/1973 | Youmans |
| 5,391,917 A | 2/1995 | Gilmour et al. |
| 5,510,298 A | 4/1996 | Redwine |
| 5,618,752 A | 4/1997 | Gaul |
| 5,767,001 A | 6/1998 | Bertagnolli et al. |
| 5,998,292 A | 12/1999 | Black et al. |
| 6,184,060 B1 | 2/2001 | Siniaguine |
| 6,322,903 B1 | 11/2001 | Siniaguine et al. |
| 6,448,168 B1 | 9/2002 | Rao et al. |
| 6,448,661 B1 | 9/2002 | Kim et al. |
| 6,465,892 B1 | 10/2002 | Suga |
| 6,472,293 B1 | 10/2002 | Suga |
| 6,538,333 B2 | 3/2003 | Kong |
| 6,599,778 B2 | 7/2003 | Pogge et al. |
| 6,639,303 B2 | 10/2003 | Siniaguine |
| 6,664,129 B2 | 12/2003 | Siniaguine |
| 6,693,361 B1 | 2/2004 | Siniaguine et al. |
| 6,707,157 B2 * | 3/2004 | Hoshino ....................... 257/773 |
| 6,740,582 B2 | 5/2004 | Siniaguine |
| 6,800,930 B2 | 10/2004 | Jackson et al. |

(Continued)

*Primary Examiner* — Chris Chu

(74) *Attorney, Agent, or Firm* — Lowe Hauptman & Ham, LLP

(57) ABSTRACT

In a method of forming a semiconductor structure, a through-silicon-via (TSV) opening is formed in a substrate. A dielectric layer is formed to continuously extend over the substrate and into the TSV opening. At least one conductive material is formed over the dielectric layer and in the TSV opening. A portion of the at least one conductive material that is over the dielectric layer is removed to form a TSV structure in the substrate. A metallic line is formed in the dielectric layer. A portion of the substrate is removed, such that the TSV structure continuously extends through the substrate and the dielectric layer.

17 Claims, 14 Drawing Sheets

(56) References Cited

U.S. PATENT DOCUMENTS

| | | | |
|---|---|---|---|
| 6,841,883 B1 | 1/2005 | Farnworth et al. | |
| 6,882,030 B2 | 4/2005 | Siniaguine | |
| 6,924,551 B2 | 8/2005 | Rumer et al. | |
| 6,962,867 B2 | 11/2005 | Jackson et al. | |
| 6,962,872 B2 | 11/2005 | Chudzik et al. | |
| 7,030,481 B2 | 4/2006 | Chudzik et al. | |
| 7,049,170 B2 | 5/2006 | Savastiouk et al. | |
| 7,060,601 B2 | 6/2006 | Savastiouk et al. | |
| 7,071,546 B2 | 7/2006 | Fey et al. | |
| 7,111,149 B2 | 9/2006 | Eilert | |
| 7,122,912 B2 | 10/2006 | Matsui | |
| 7,157,787 B2 | 1/2007 | Kim et al. | |
| 7,193,308 B2 | 3/2007 | Matsui | |
| 7,262,495 B2 | 8/2007 | Chen et al. | |
| 7,297,574 B2 | 11/2007 | Thomas et al. | |
| 7,335,972 B2 | 2/2008 | Chanchani | |
| 7,354,798 B2 | 4/2008 | Pogge et al. | |
| 7,355,273 B2 | 4/2008 | Jackson et al. | |
| 7,402,903 B2 | 7/2008 | Matsuo | |
| 7,485,968 B2 | 2/2009 | Enquist et al. | |
| 7,615,480 B2 | 11/2009 | Boyd et al. | |
| 7,839,163 B2 * | 11/2010 | Feng et al. | 326/38 |
| 7,863,188 B2 | 1/2011 | Tsurume et al. | |
| 8,008,667 B2 | 8/2011 | Koyama et al. | |
| 8,076,234 B1 * | 12/2011 | Park et al. | 438/622 |
| 8,174,093 B2 | 5/2012 | Hayasaka et al. | |
| 8,222,142 B2 * | 7/2012 | Furuya | 438/687 |
| 8,354,327 B2 * | 1/2013 | Zengxiang et al. | 438/429 |
| 8,367,553 B2 * | 2/2013 | Tsao et al. | 438/692 |
| 8,426,308 B2 * | 4/2013 | Han et al. | 438/639 |
| 2004/0080013 A1 | 4/2004 | Kimura et al. | |
| 2005/0014311 A1 | 1/2005 | Hayasaka et al. | |
| 2007/0001312 A1 | 1/2007 | Murayama et al. | |
| 2009/0014888 A1 * | 1/2009 | Lee et al. | 257/774 |
| 2009/0045487 A1 * | 2/2009 | Jung | 257/621 |
| 2009/0108464 A1 | 4/2009 | Uchiyama | |
| 2009/0160051 A1 * | 6/2009 | Lee | 257/737 |
| 2009/0191708 A1 * | 7/2009 | Kropewnicki et al. | 438/667 |
| 2009/0278230 A1 * | 11/2009 | Komuro | 257/532 |
| 2009/0321796 A1 * | 12/2009 | Inohara | 257/288 |
| 2010/0133660 A1 | 6/2010 | Huyghebaert et al. | 257/621 |
| 2010/0187694 A1 * | 7/2010 | Yu et al. | 257/751 |

\* cited by examiner

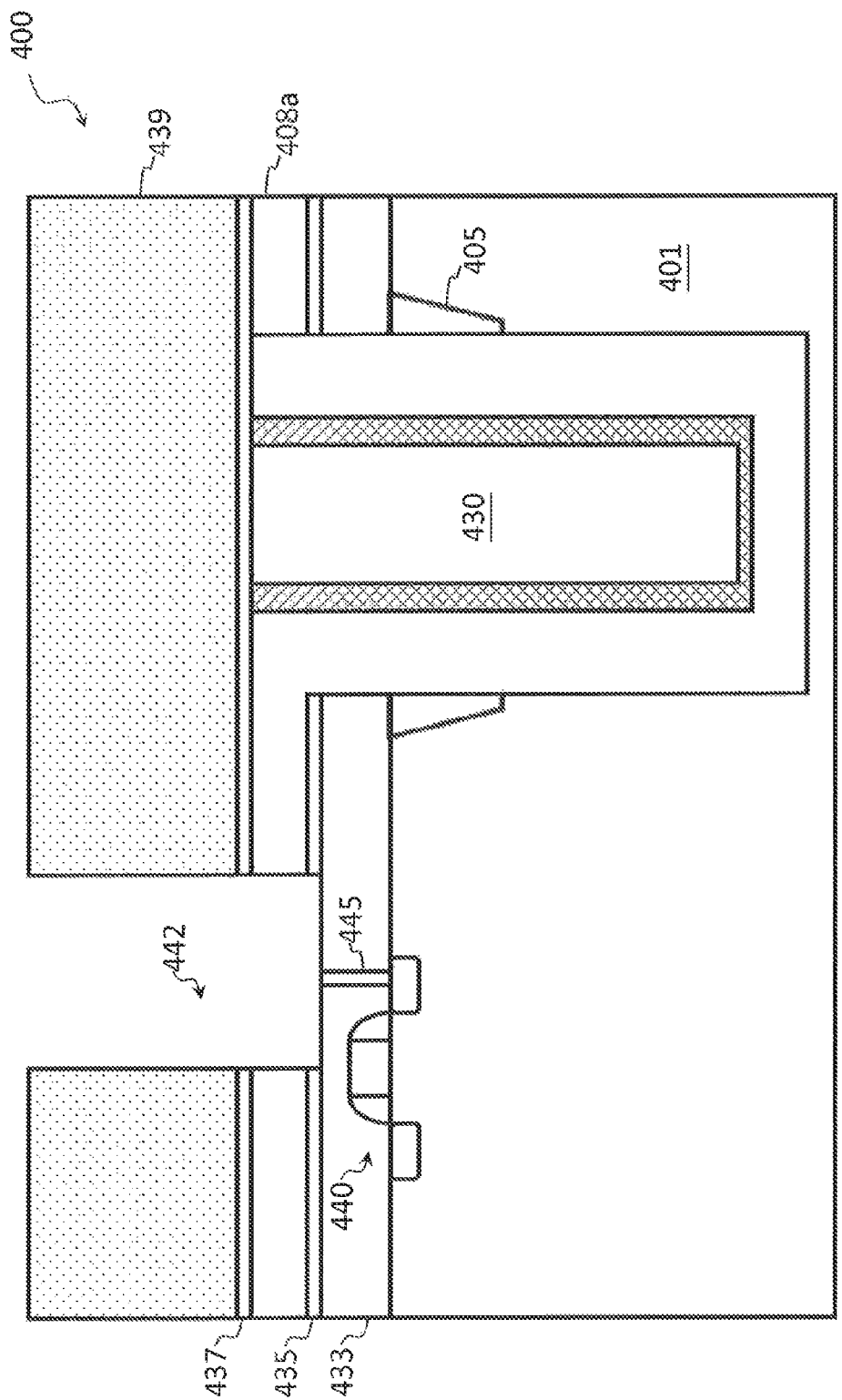

_US 8,673,775 B2_

METHODS OF FORMING SEMICONDUCTOR STRUCTURES

RELATED APPLICATION(S)

The present application is a divisional of U.S. application Ser. No. 13/161,153, filed Jun. 15, 2011, the disclosure of which is incorporated herein by reference in its entirety.

TECHNICAL FIELD

The present disclosure relates generally to the field of semiconductor and, more particularly, to methods of forming semiconductor structures.

BACKGROUND

Since the invention of the integrated circuit, the semiconductor industry has experienced continual rapid growth due to continuous improvements in the integration density of various electronic components (i.e., transistors, diodes, resistors, capacitors, etc.). For the most part, this improvement in integration density has come from repeated reductions in minimum feature size, allowing for the integration of more components into a given area.

These integration improvements are essentially two-dimensional (2D) in nature, in that the volume occupied by the integrated components is essentially on the surface of the semiconductor wafer. Although dramatic improvements in lithography have resulted in considerable improvements in 2D integrated circuit formation, there are physical limits to the density that can be achieved in two dimensions. One of these limits is the minimum size needed to make these components. Also, when more devices are put into one chip, more complex designs are required.

Three-dimensional integrated circuits (3D IC) are therefore created to resolve the above-discussed limitations. In a conventional formation process of 3D IC, two wafers, each including an integrated circuit, are formed. The wafers are then bonded with the devices aligned. Deep vias are then formed to interconnect devices on the first and second wafers.

Recently, through-silicon-vias (TSVs), also referred to as through-wafer vias, are increasingly used as a way of implementing 3D IC. Generally, a bottom wafer is bonded to a top wafer. Both wafers include integrated circuits formed over substrates. The integrated circuits in the bottom wafer are connected to the integrated circuits in the wafer through interconnect structures. The integrated circuits in the wafers are further connected to external pads through through-silicon-vias. The stacked wafers can be subjected to a sawing process to provide a plurality of stacked die structures.

BRIEF DESCRIPTION OF THE DRAWINGS

The present disclosure is understood from the following detailed description when read with the accompanying figures. It is noted that, in accordance with the standard practice in the industry, various features are not drawn to scale and are used for illustration purposes only. In fact, the numbers and dimensions of the various features may be arbitrarily increased or reduced for clarity of discussion.

FIGS. 4A-4K are schematic cross-sectional views of a semiconductor structure during various fabrication stages.

DETAILED DESCRIPTION OF THE DISCLOSURE

Figure 1:
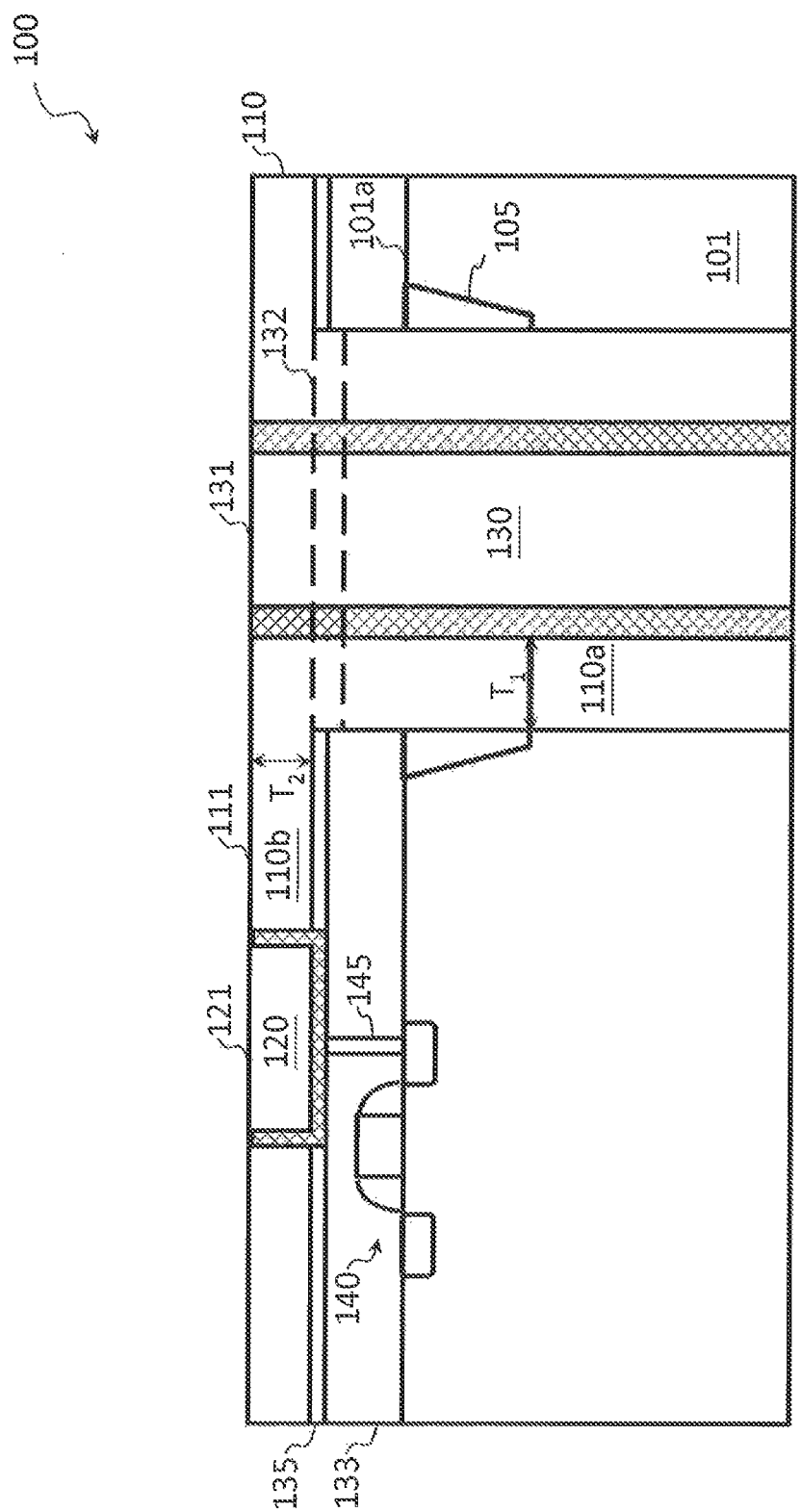
FIG. 1 is a schematic cross-sectional view of an exemplary semiconductor structure.

A method of forming a TSV structure that is known to the applicants includes forming an interlayer dielectric (ILD) layer over a substrate. A TSV opening is patterned through the ILD layer and into the substrate. An oxide liner and a TSV metallic material are sequentially deposited over the ILD layer and filled in the TSV opening. The oxide liner and the TSV metallic material is then subjected to a chemical mechanical polish (CMP) process, such that portions of the oxide liner and the TSV metallic material that are over the ILD layer are removed.

After the CMP process, an inter-metal dielectric 1 (IMD 1) layer is formed over the ILD layer and the TSV structure. Metallic lines or plugs of a metal 1 (M1) layer are then formed in the IMD 1 layer and electrically coupled with the TSV structure and contact plugs in the ILD layer. That is, an interface is between the TSV structure and the metallic plug formed thereon.

The width of the TSV opening may be increased due to the process/technology node evolution. Due to the wider TSV opening, a thicker oxide liner is deposited in the TSV opening. To remove the portion of the oxide liner over the ILD layer, the CMP process may also substantially remove the ILD layer and damage the contact plugs formed therein.

It is understood that the following disclosure provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIG. 1 is a schematic cross-sectional view of an exemplary semiconductor structure. In FIG. 1, a semiconductor structure 100 includes a dielectric layer 110 that is disposed over a substrate 101. The semiconductor structure 100 includes a metallic line 120 that is disposed in the dielectric layer 110. A through-silicon-via (TSV) structure 130 that continuously extends through the dielectric layer 110 and the substrate 101. A surface 121 of the metallic line 120 is substantially level with a surface 131 of the TSV structure 130.

In some embodiments, the substrate 101 may include an elementary semiconductor including silicon or germanium in a crystalline, a polycrystalline, or an amorphous structure; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, GaInAs, GaInP, and/or GaInAsP; any other suitable material; or combinations thereof. In at least one embodiment, the alloy semiconductor substrate may have a gradient SiGe feature in which the Si and Ge composition change from one ratio at one location to another ratio at another location of the gradient SiGe feature. In another embodiment, the alloy SiGe is formed over a silicon substrate. In another embodiment, a SiGe substrate is strained. Furthermore, the semiconductor substrate may be a semiconductor on insulator, such as a silicon on insulator (SOI), or a thin film transistor (TFT). In some examples, the semiconductor substrate may include a doped epi layer or a buried layer. In other examples, the compound semiconductor substrate may have a multilayer structure, or the substrate may include a multilayer compound semiconductor structure.

In some embodiments, an isolation structure 105 is formed in the substrate 101 as shown in FIG. 1. The isolation structure 105 can be a shallow trench isolation (STI) structure, a local oxidation of silicon (LOCOS) structure, and/or any combinations thereof. The isolation structure 105 can be made of at least one material, such as silicon oxide, silicon nitride, silicon oxynitride, other dielectric materials, and/or any combinations thereof.

In some embodiments, the dielectric layer 110 can be made of at least one material, such as silicon oxide, silicon nitride, silicon oxynitride, silicon carbide, silicon oxycarbide, silicon carbon nitride, a low dielectric constant (low-k) dielectric material, an ultra low-k dielectric material, and/or any combinations thereof. In some embodiments, a surface 111 of the dielectric layer 110 is substantially leveled with the surface 131 of the TSV structure 130.

Referring to FIG. 1, in some embodiments the dielectric layer 110 continuously extends between the TSV structure 130 and the substrate 101. For example, the dielectric layer 110 can include portions 110a and 110b. The portion 110a can continuously extend between the substrate 101 and the TSV structure 130. The portion 110b can extend over a surface 101a of the substrate 101. In some embodiments, the portion 110a has a thickness $T_1$ and the portion 110b has a thickness $T_2$. The thickness $T_1$ is larger than the thickness $T_2$. In some embodiments, the dielectric layer 110 is referred to as a liner layer that continuously extends over the substrate 101 and on sidewalls of an opening (not labeled) in which the portion 110a and the TSV structure 130 are disposed.

Referring to FIG. 1, the metallic line 120 is disposed over the substrate 101. The metallic line 120 can be routed for electrical connection. In some embodiments, the metallic line 120 can include at least one barrier material and at least one conductive material (not labeled). The at least one barrier material can include, for example, titanium, titanium-nitride, tantalum, tantalum-nitride, other barrier materials, and/or combinations thereof. The at least one conductive material can include, for example, aluminum, copper, aluminum-copper, polysilicon, other conductive materials, and/or combinations thereof.

Referring again to FIG. 1, the TSV structure 130 continuously extends through the substructure 101 and the dielectric layer 110. In some embodiments, the TSV structure 130 can include at least one barrier material and at least one conductive material (not labeled). The at least one barrier material can include, for example, titanium, titanium-nitride, tantalum, tantalum-nitride, other barrier materials, and/or combinations thereof. The at least one conductive material can include, for example, aluminum, copper, aluminum-copper, polysilicon, other conductive materials, and/or combinations thereof.

In some embodiments, the semiconductor structure 100 may include various passive and active microelectronic devices, such as resistors, capacitors, inductors, diodes, metal-oxide-semiconductor field effect transistors (MOSFETs), complementary MOS (CMOS) transistors, bipolar junction transistors (BJTs), laterally diffused MOS (LDMOS) transistors, high power MOS transistors, FinFET transistors, other types of transistors, and/or any combinations thereof.

For example, the semiconductor structure 100 includes at least one transistor, e.g., a transistor 140 that is disposed over the substrate 101 as shown in FIG. 1. The transistor 140 is electrically coupled with the metallic line 120 through at least one contact plug, e.g., a contact plug 145. The contact plug 145 is disposed in and through a dielectric layer 133 that is disposed over the substrate 101. In some embodiments, the TSV structure 130 does not have an interface at a region 132 that is substantially leveled with an interface between the contact plug 145 and the metallic line 120.

In some embodiments, the dielectric layer 133 can be made of at least one material, such as silicon oxide, e.g., undoped silicate glass (USG), boron-doped silicate glass (BSG), phosphor-doped silicate glass (PSG), boron-phosphor-doped silicate glass (BPSG), or the like, silicon oxy-nitride, silicon nitride, a low-k material, and/or any combinations thereof. In some embodiments, the dielectric layer 133 is referred to as an inter-layer dielectric (ILD) layer. It is noted that though merely showing a single dielectric layer 133 in FIG. 1, the scope of this application is not limited thereto. In some embodiments, a multiple-layer dielectric structure can be disposed over the substrate 101.

In some embodiments, at least one etch-stop layer, e.g., an etch-stop layer 135 is disposed between the dielectric layers 110 and 133. In some embodiments, the etch-stop layer 135 can be made of a material including at least one of, for example, nitride, oxynitride, carbide, oxycarbide, other dielectric materials having an etch selectivity substantially different from that of the dielectric layer 133, and/or any combinations thereof. It is noted that though merely showing a single etch-stop layer 135 in FIG. 1, the scope of this application is not limited thereto. In some embodiments, a multiple-layer etch-stop structure can be disposed over the dielectric layer 133 and the substrate 101.

Referring again to FIG. 1, the metallic line 120 is disposed over the dielectric layer 133. In some embodiments, the metallic line 120 can be referred to as a portion of a metal-1 ($M_1$) layer. The portion 110b of the dielectric layer 110 can be referred to as an inter-metal dielectric 1 (IMD1) layer. It is noted that the structure shown in FIG. 1 is merely exemplary and the scope of this application is not limited thereto. In some embodiments, the metallic line 120 can be a portion of any one of metal layers, e.g., $M_2$, $M_3$, $M_4$, etc. For example, the metallic line 120 is a portion of a $M_2$ layer. In at least this embodiment, the surface of the $M_2$ layer can be substantially leveled with the surface of the TSV structure 130. The TSV structure 130 does not have an interface at a region that is substantially leveled with an interface between the IMD1 layer and a IMD2 layer (not shown) that is disposed over the IMD1 layer and in which the $M_2$ layer is formed.

Figure 2:
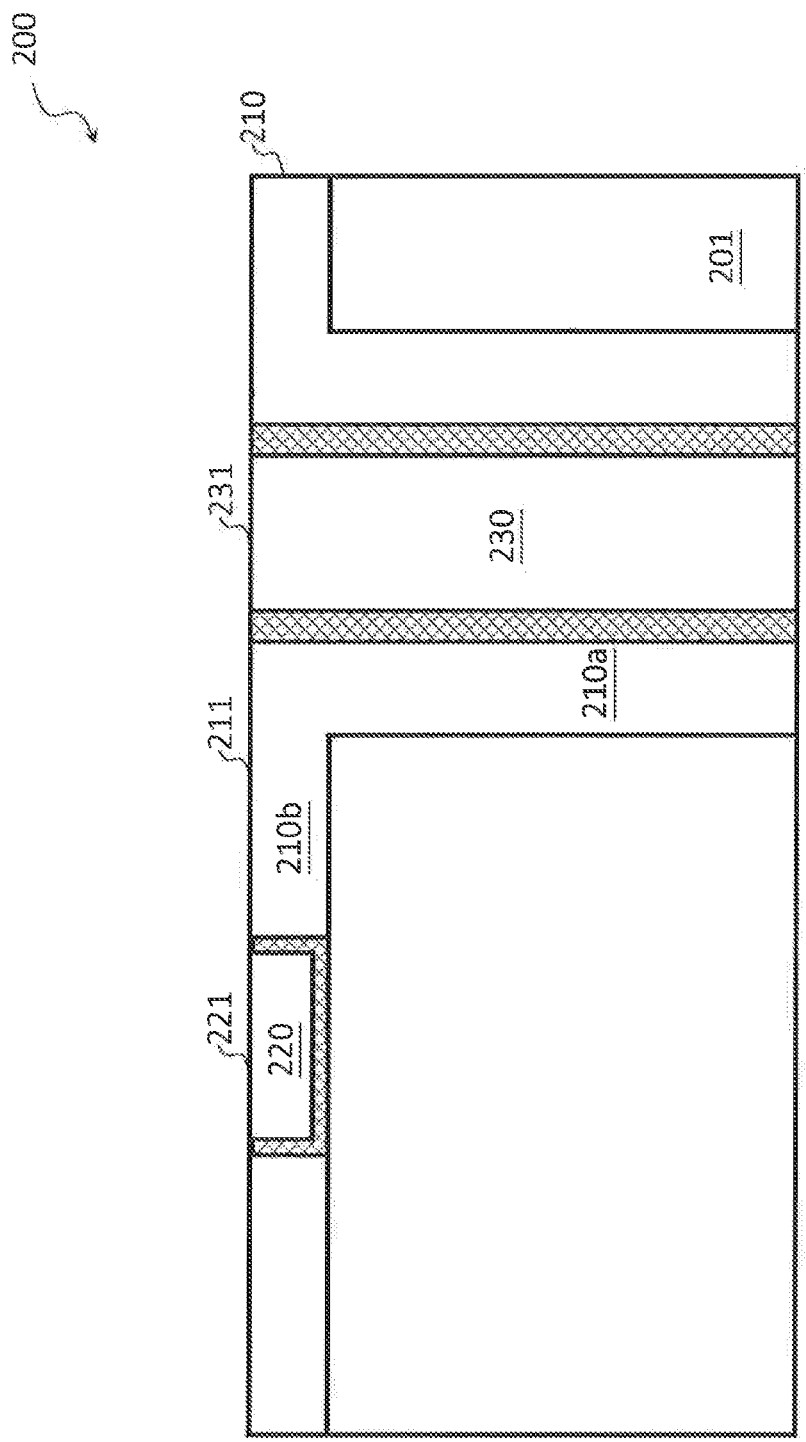
FIG. 2 is a schematic cross-sectional view of another exemplary semiconductor structure.

FIG. 2 is a cross-sectional view of another exemplary semiconductor structure. Items of a semiconductor structure 200 in FIG. 2 that are the same or similar items of the semiconductor structure 100 in FIG. 1 are indicated by the same reference numerals, increased by 100. In FIG. 2, a semiconductor structure can be an interposer 200. The interposer 200 can be configured to provide an electrical connection in a 3-dimensional (3-D) package system.

In some embodiments, the interposer 200 can include at least one passive device, e.g., a capacitor, a resistor, and/or an inductor. In other embodiments, the interposer 200 can be substantially free from including any active device, e.g., metal-oxide-semiconductor (MOS) transistors, bipolar junction transistors (BJTs), complementary MOS (CMOS) transistors, etc. In still other embodiments, the interposer 200 does not include any active device and passive device. The interposer 200 can be merely configured for providing an electrical connection. In yet still other embodiments, the interposer 200 can be referred to as a passive interposer.

Referring to FIG. 2, the interposer 200 includes a dielectric layer 210 that is disposed over a substrate 201. The interposer 200 includes a metallic line 220 that is disposed in the dielectric layer 210. A through-silicon-via (TSV) structure 230 that continuously extends through the dielectric layer 210 and the substrate 201. A surface 221 of the metallic line 220 is substantially level with a surface 231 of the TSV structure 230. In some embodiments, a surface 211 of the dielectric layer 210 is substantially level with the surface 231 of the TSV structure 230.

In some embodiments, the dielectric layer 210 can include portions 210a and 210b. The portion 210a can be disposed between the substrate 201 and the TSV structure 230. The portion 210b can be disposed over the substrate 201. In some embodiments, the dielectric layer 210 can be referred to as a liner layer that continuously extends over the substrate 201 and on sidewalls of an opening (not labeled) in which the portion 210a and the TSV structure 230 are disposed. In other embodiments, the portion 210b of dielectric layer 210 can be referred to as a dielectric material portion of a redistribution layer (RDL). The metallic line 220 can be referred to as a conductive material portion of the RDL.

Figure 3:
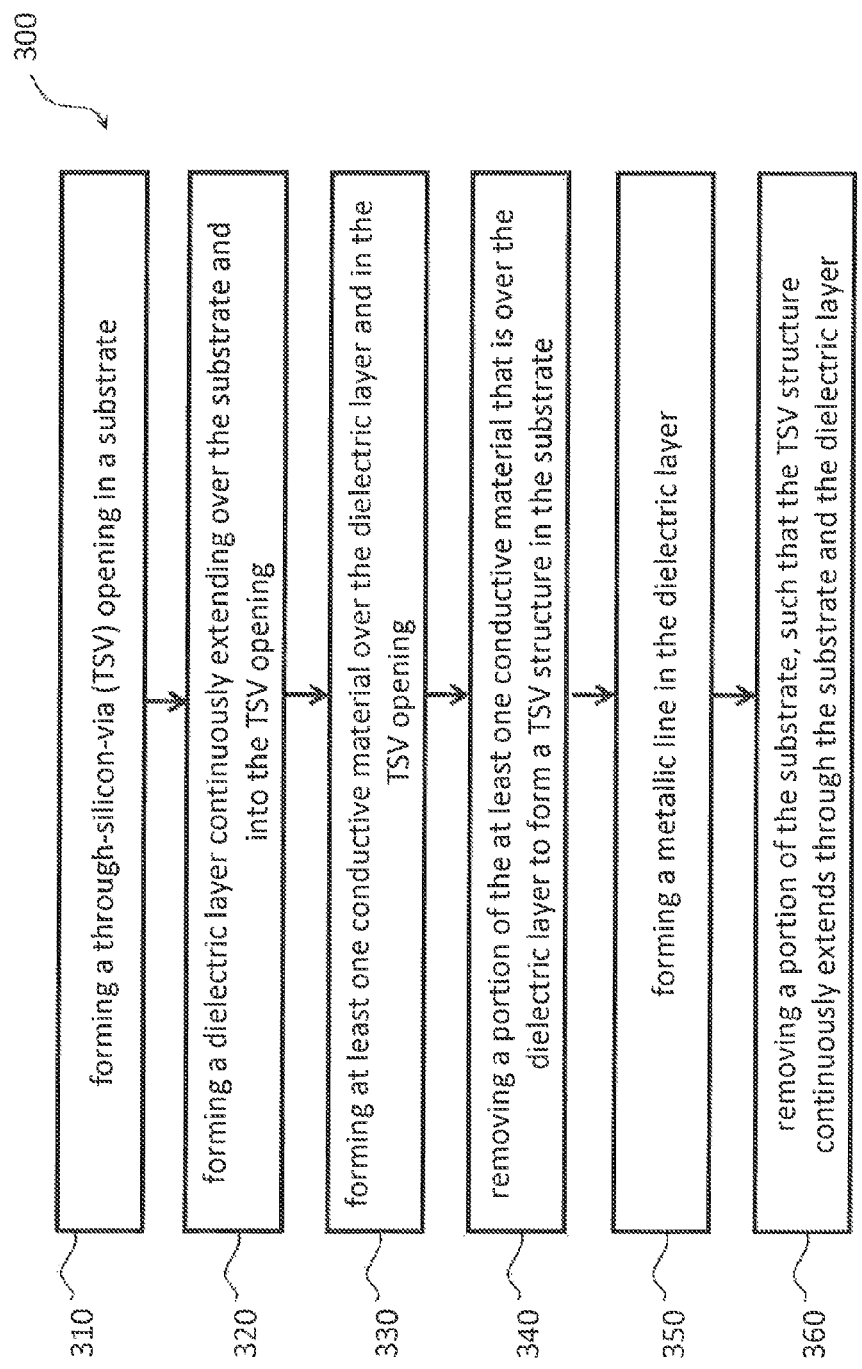
FIG. 3 is a flowchart of an exemplary method of forming a semiconductor structure including a TSV structure through a substrate.

FIG. 3 is a flowchart of an exemplary method of forming a semiconductor structure including a TSV structure through a substrate. FIGS. 4A-4K are schematic cross-sectional views of a semiconductor structure during various fabrication stages. Items of a semiconductor structure 400 in FIGS. 4A-4K that are the same or similar items of the semiconductor structure 100 in FIG. 1 are indicated by the same reference numerals, increased by 300. It is understood that FIGS. 3 and 4A-4K have been simplified for a better understanding of the concepts of the present disclosure. Accordingly, it should be noted that additional processes may be provided before, during, and after the methods of FIGS. 3 and 4A-4K, and that some other processes may only be briefly described herein.

Referring to FIG. 3, a method 300 of forming a semiconductor structure includes forming a through-silicon-via (TSV) opening in a substrate (block 310). A dielectric layer is formed, continuously extending over the substrate and into the TSV opening (block 320). At least one conductive material is formed over the dielectric layer and in the TSV opening (block 330). A portion of the at least one conductive material that is over the dielectric layer is removed to form a TSV structure in the substrate (block 340). A metallic line is formed in the dielectric layer (block 350). A portion of the substrate is removed, such that the TSV structure continuously extends through the substrate and the dielectric layer (block 360).

Figure 4A:
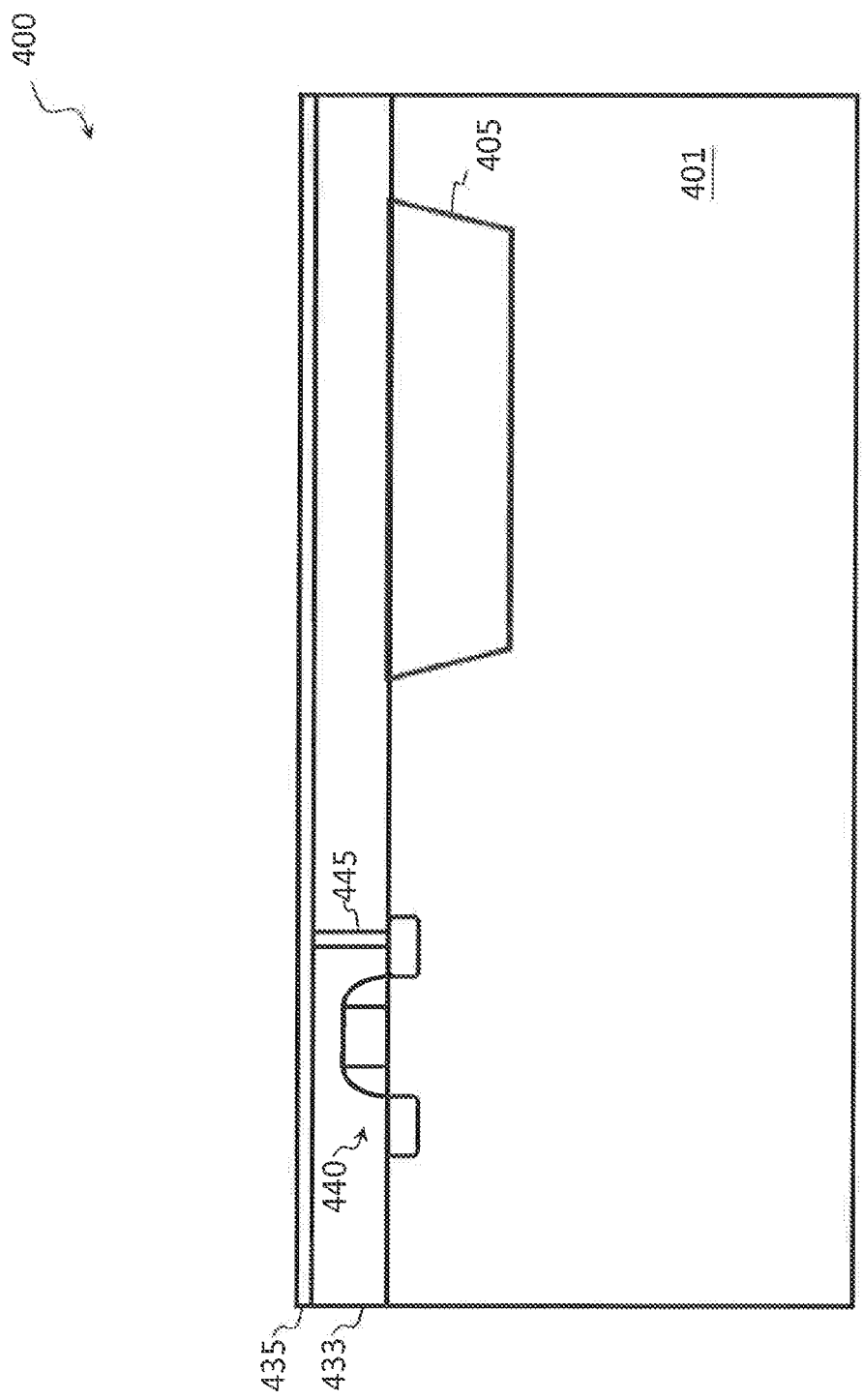

In some embodiments, a semiconductor structure 400 includes a substrate 401 as shown in FIG. 4A. At least one isolation structure, e.g., an isolation structure 405 is formed in the substrate 401. At least one transistor, e.g., a transistor 440 is formed over the substrate 401. A dielectric layer 433 is formed over the substrate 401. At least one contact plug, e.g., a contact plug 445 is formed in the dielectric layer 433. An etch stop layer 435 is formed over the dielectric layer 433. In some embodiments, the dielectric layer 433 can have a thickness of about hundreds to thousands of angstroms (Å).

Figure 4B:
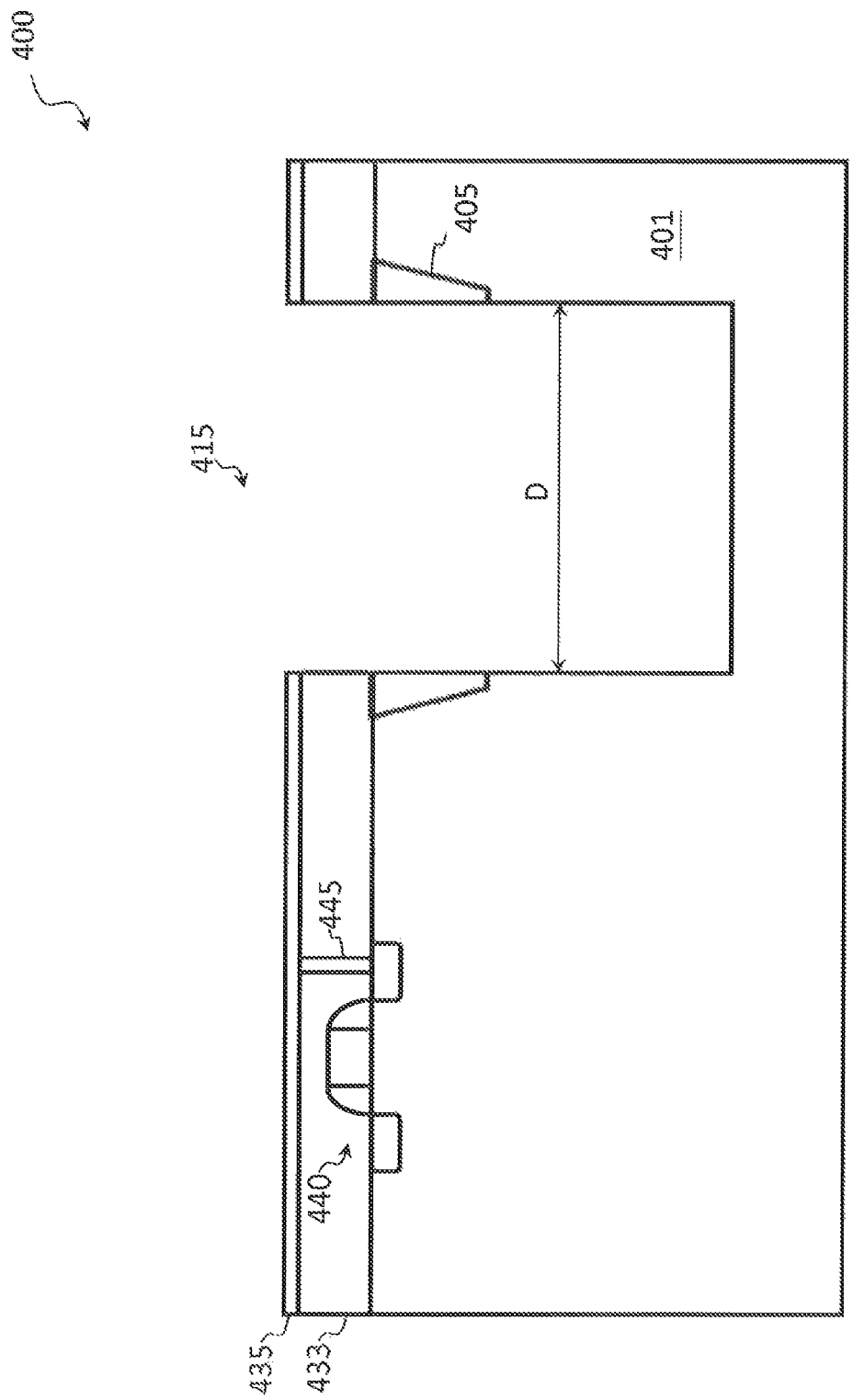

Referring again to FIG. 3, the block 310 includes forming a through-silicon-via (TSV) opening in a substrate. For example, a TSV opening 415 is formed in the substrate 401 as shown in FIG. 4B. In some embodiments, the TSV opening 415 is formed through the etch stop layer 435, the dielectric layer 433 and the isolation structure 405. In some embodiments, the TSV opening 415 has a dimension (D) of about several to tens of microns (μm).

In some embodiments, the TSV opening 415 can be patterned by forming a patterned mask layer (not shown) over the etch stop layer 435. The patterned mask layer exposes a region corresponding to the portions of the etch stop layer 435, the dielectric layer 433, the isolation structure 405 and the substrate 401 that are to be removed. An etching process, e.g., a dry etching process, by using the patterned mask layer as an etch mask, can remove the portions of the etch stop layer 435, the dielectric layer 433, the isolation structure 405 and the substrate 401 to form the TSV opening 415. After the etching processing, the patterned mask layer is removed.

Figure 4C:
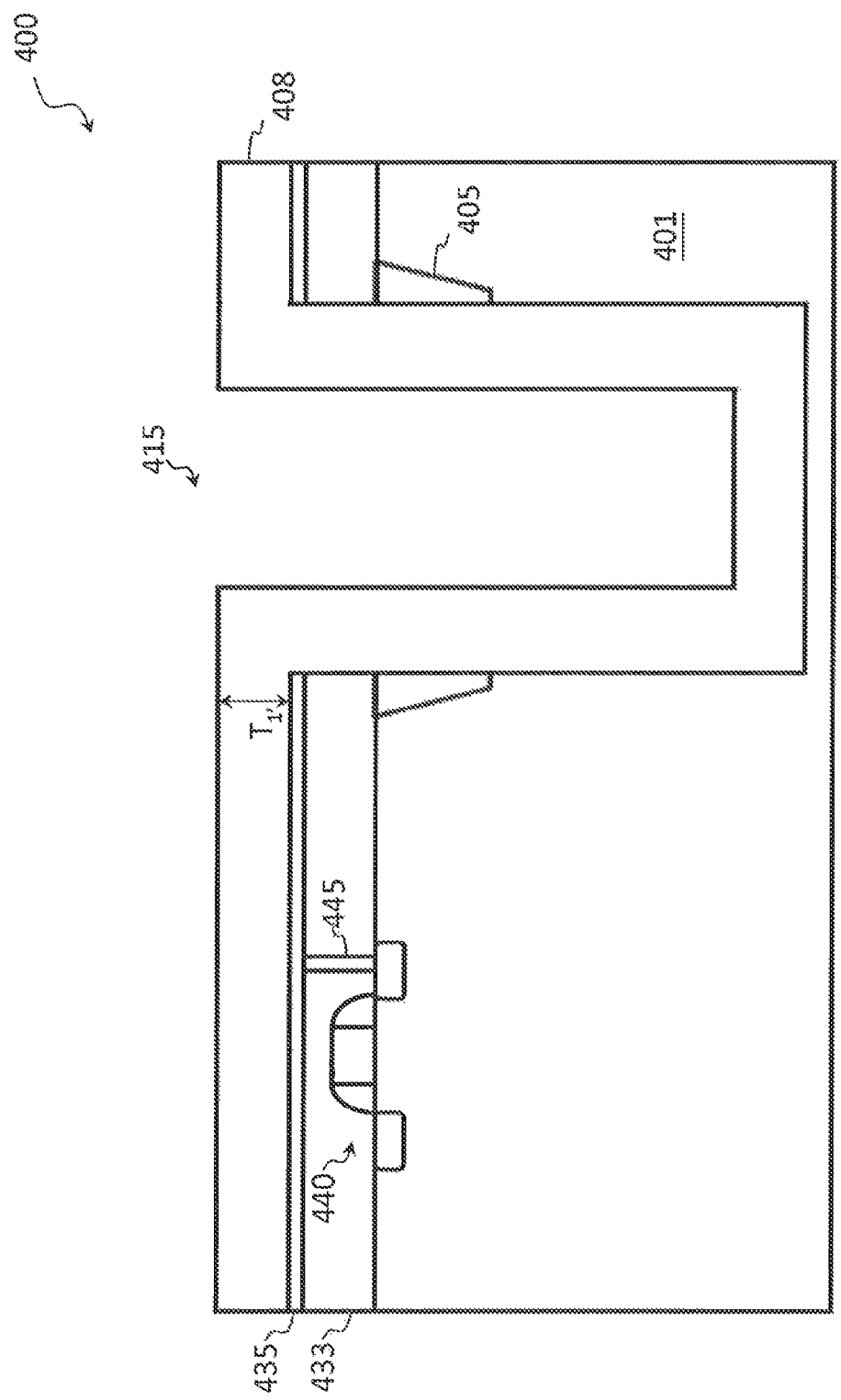

As noted, the block 320 (shown in FIG. 3) includes forming a dielectric layer that continuously extends over a substrate and into the TSV opening. For example, a dielectric layer 408 is formed and continuously extends over the substrate 401 and into the TSV opening 415 as shown in FIG. 4C. In some embodiments, a portion of the dielectric layer 408 is formed over the etch stop layer 435 and the dielectric layer 433. In other embodiments, the dielectric layer 408 is substantially conformal over the etch stop layer 435 and in the TSV opening 415. The dielectric layer 408 can be formed by, for example, chemical vapor deposition (CVD), high density plasma CVD, and/or other suitable methods. In some embodiments, the dielectric layer 408 can be referred to as a liner layer. In other embodiments, the dielectric layer 408 can have a thickness $T_1'$ ranging from about thousands of angstroms to about several microns.

Figure 4D:
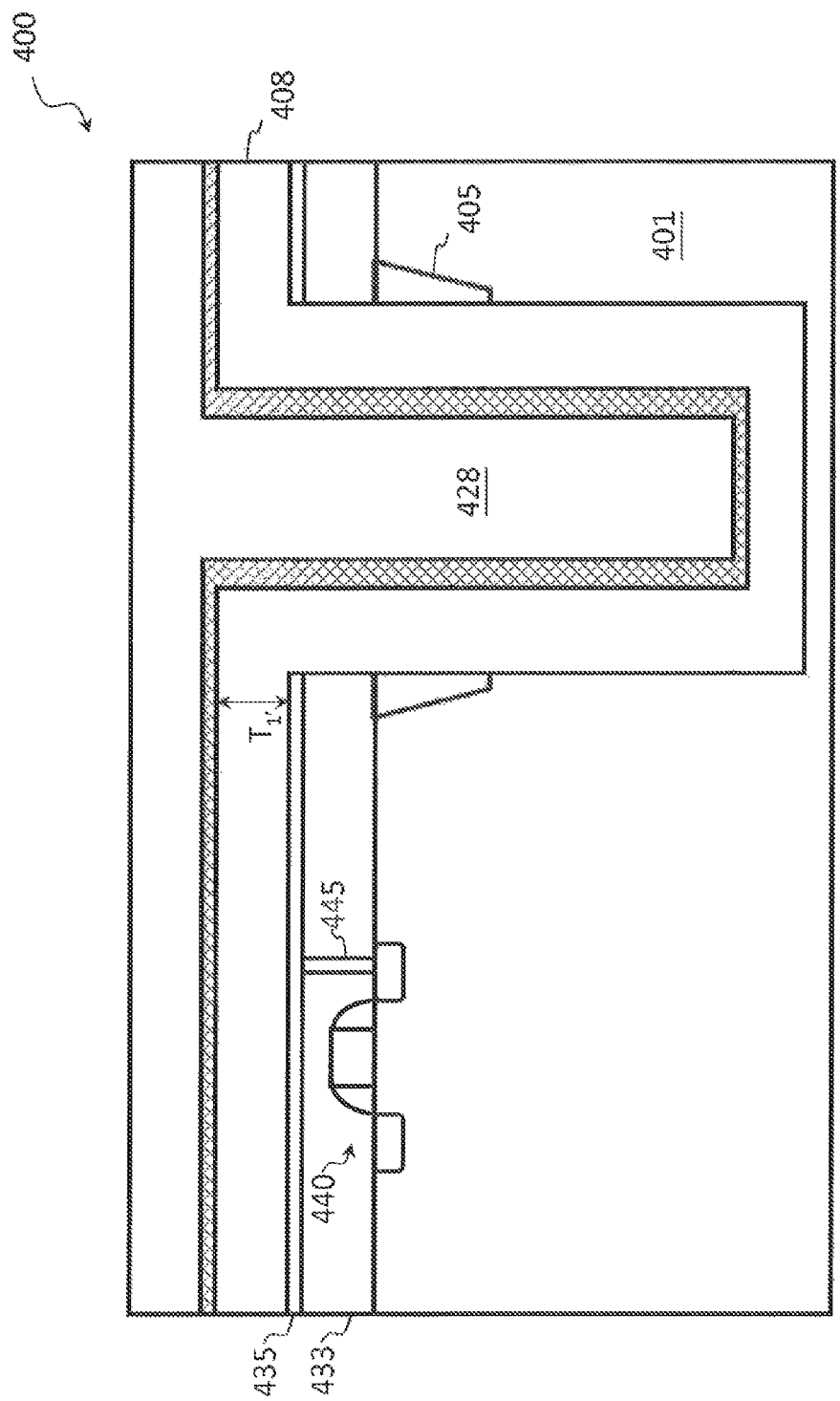

Referring to FIG. 3, the block 330 includes forming at least one conductive material over the dielectric layer and in the TSV opening. For example, at least one conductive material 428 is formed over the dielectric layer 408 and in the TSV opening 415 as shown in FIG. 4D. In some embodiments, the at least one conductive material 428 can include a barrier metallic material and a metallic material. In some embodiments, the barrier metallic material is substantially conformal in the TSV opening 415. The barrier metallic material can be formed by, for example, CVD, physical vapor deposition (PVD), atomic layer deposition (ALD), and/or other suitable processes. The metallic material can be formed by, for example, CVD, electroplating, and/or other suitable processes to fill the metallic material in the TSV opening 415.

Figure 4E:
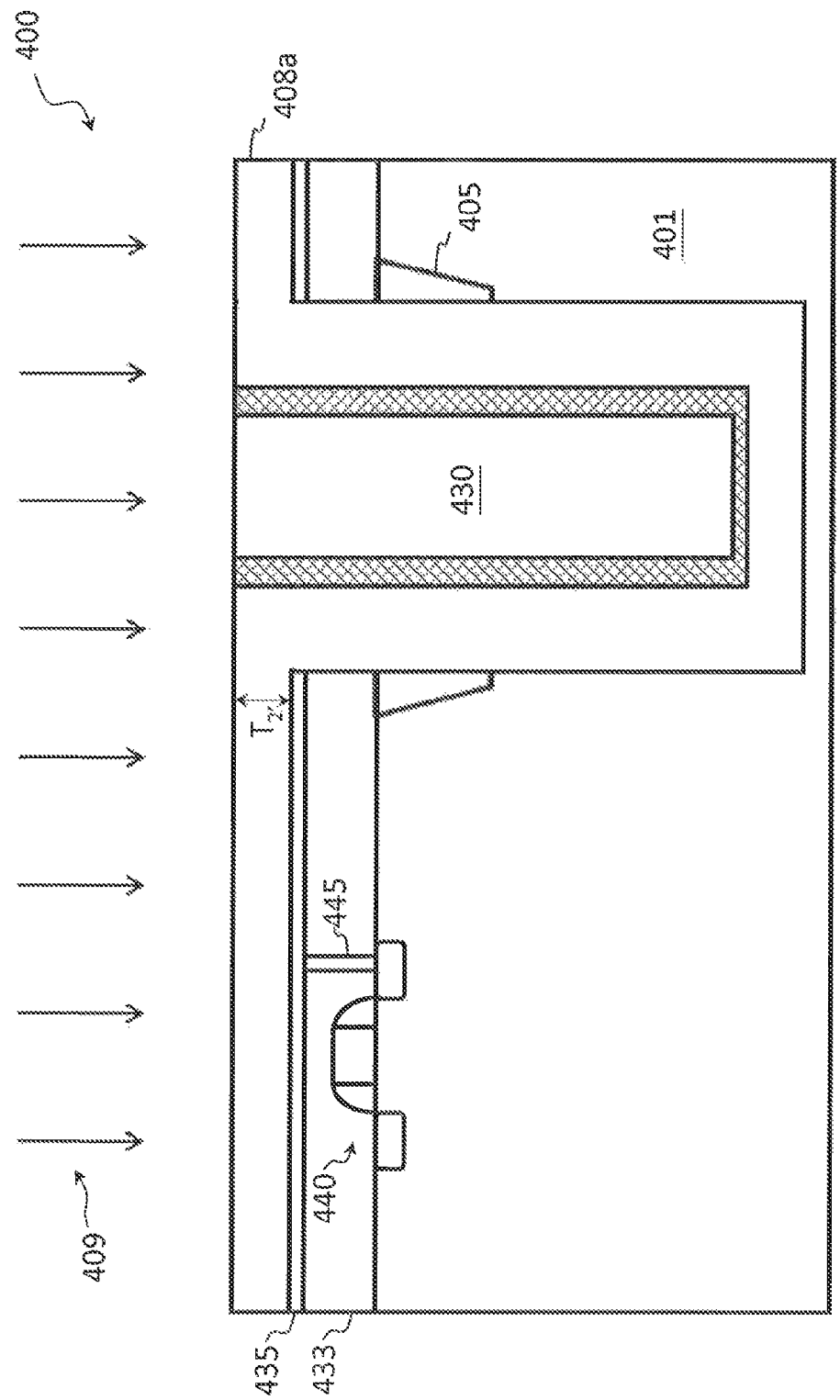

Referring to FIG. 3, the block 340 includes removing a portion of the at least one conductive material that is over the dielectric layer to form a TSV structure in the substrate. For example, a removal process 409 removes a portion of the at least one conductive material 428 that is over the dielectric layer 408 to form a TSV structure 430 in the substrate 401 as shown in FIG. 4E. In some embodiments, the removal process 409 can include a chemical mechanical polish (CMP) process, a dry etching process, and/or any combinations thereof. The TSV structure 430 at this stage is not formed completely through the substrate 401.

In some embodiments, the removal process 409 may also remove a portion of the dielectric layer 408 that is adjacent to the at least one conductive material 428 (shown in FIG. 4D). The remaining portion of the dielectric layer 408 is referred to as a dielectric layer 408a. In at least this embodiment, the thickness $T_1'$ of the dielectric layer 408 (shown in FIG. 4D) is reduced to the thickness $T_2'$ of the dielectric layer 408a (shown in FIG. 4E).

Figure 4F:
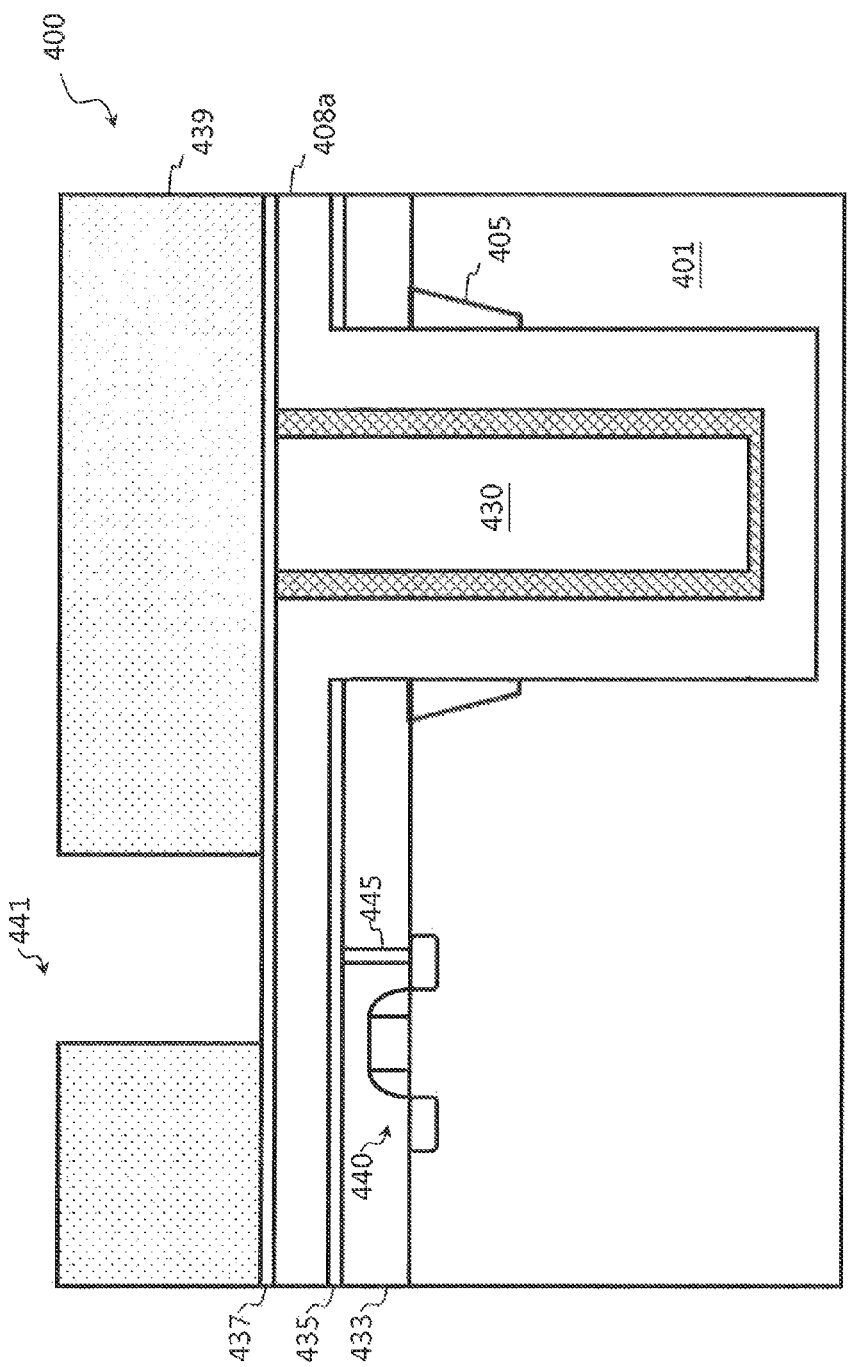

Referring to FIG. 3, the block 350 includes forming a metallic line in the dielectric layer. In some embodiments, forming the metallic line can include forming a cap layer 437 over the dielectric layer 408a as shown in FIG. 4F. The cap layer 437 can be made of at least one material that is similar to or the same as the material of the etch stop layer 435. The etch stop layer 435 can be provided to protect the TSV structure 430 from being oxidized and/or interacting with a patterned mask layer 439 that is formed thereon.

In some embodiments, the block 350 can include forming the patterned mask layer 439 over the cap layer 437. The patterned mask layer 439 has at least one opening, e.g., an opening 441 that exposes a portion of the cap layer 437 (not labeled). In FIG. 4F, the patterned mask layer 439 covers the TSV structure 430. In some embodiments, the patterned mask layer 439 can be made of a photoresist material.

In some embodiments, the block 350 can include an etching process removing the exposed portion of the cap layer 437 and a portion of the dielectric layer 408a by using the patterned mask layer 439 as an etch mask to form an opening 442 in the dielectric layer 408a as shown in FIG. 4G. In some embodiments, the etching process can also remove a portion of the etch stop layer 435 to expose a top surface of the contact plug 445.

Figure 4H:
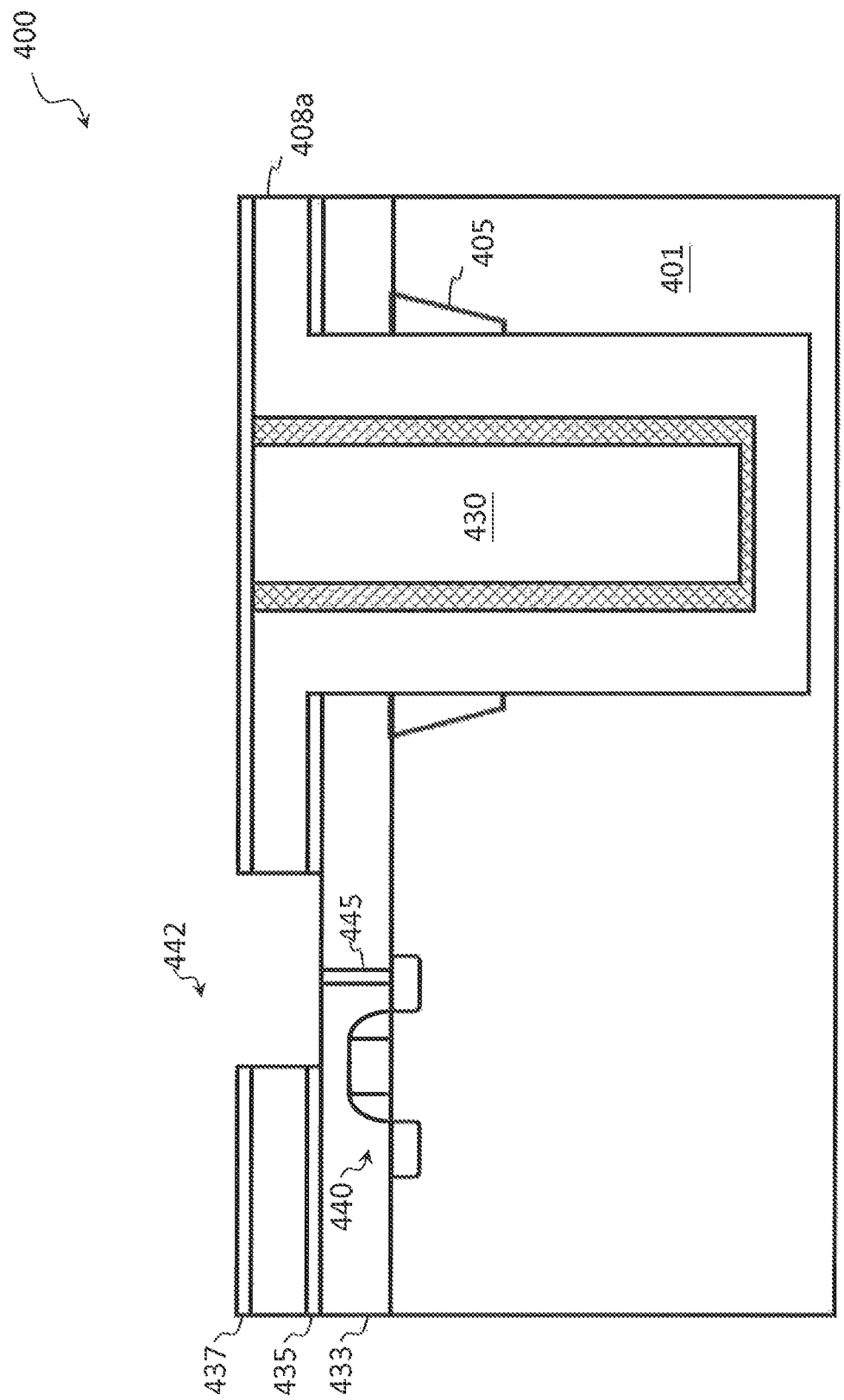

In some embodiments, the block 350 can include a removal process removing the patterned mask layer 439 as shown in FIG. 4H. The removal process can include a photoresist removal process. As shown in FIG. 4H, the opening 442 is patterned in the cap layer 437, the dielectric layer 408a and the etch stop layer 435.

Figure 4I:
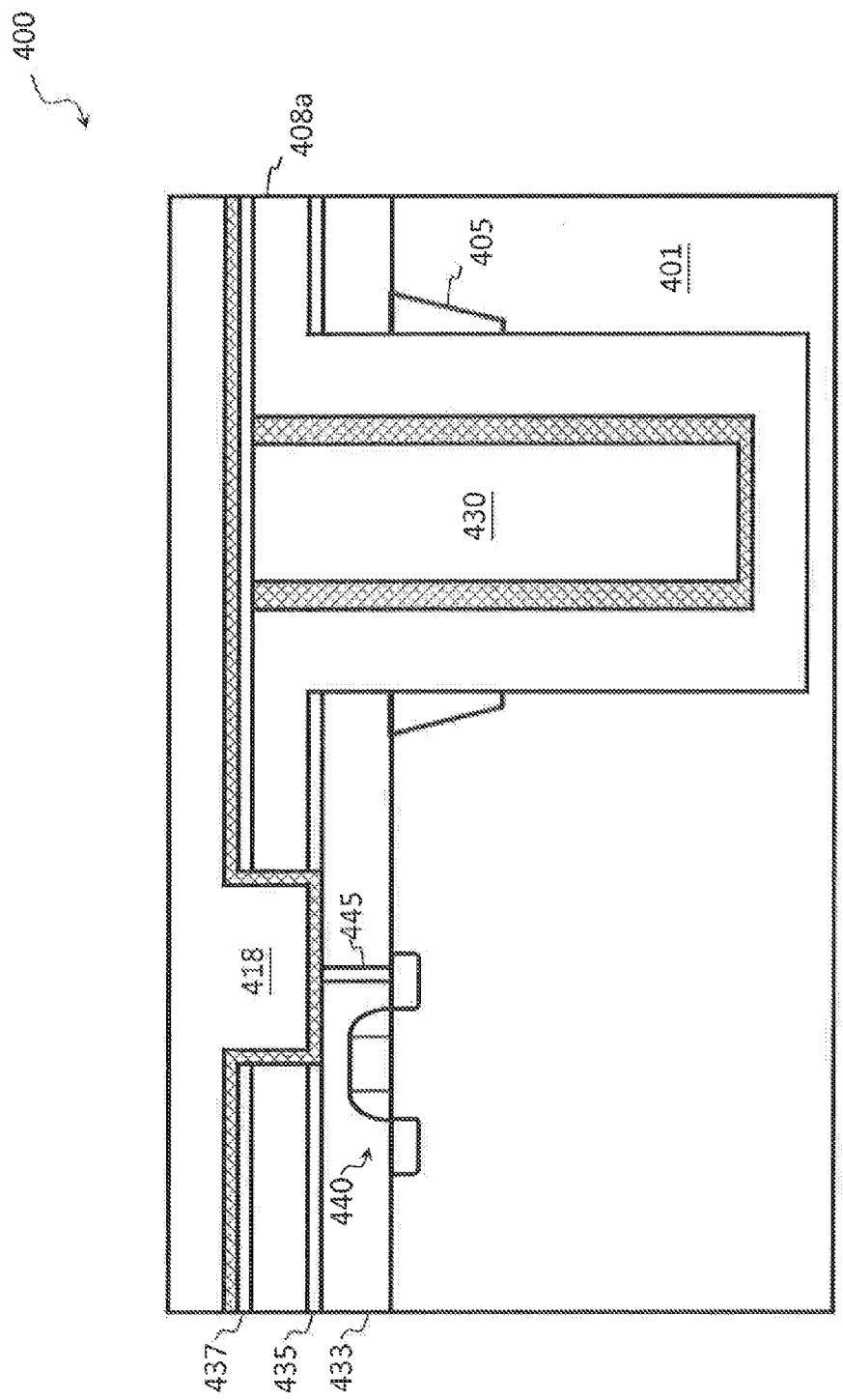

In some embodiments, the block 350 can include forming the metallic line in the opening 422 in the dielectric layer 408a. For example, the block 350 can include forming at least one metallic material 418 over the cap layer 437 and in the opening 422 as shown in FIG. 4I. In some embodiments, the at least one metallic material 418 can include a barrier metallic material and a metallic material. The barrier metallic material can be formed by, for example, CVD, physical vapor deposition (PVD), atomic layer deposition (ALD), and/or other suitable processes. The metallic material can be formed by, for example, CVD, electroplating, and/or other suitable processes to fill the metallic material in the opening 422.

Figure 4J:
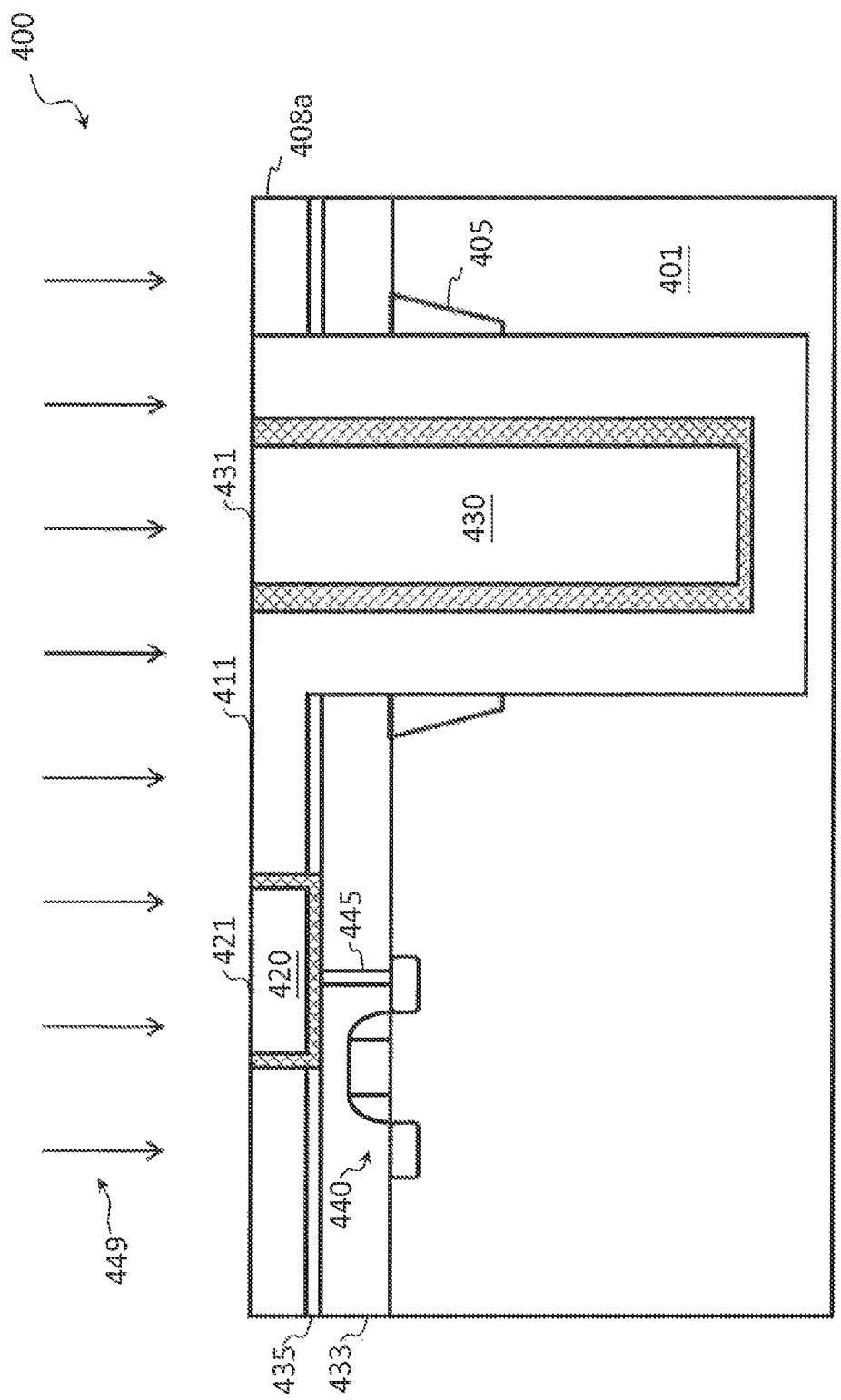

In some embodiments, the block 350 can include removing a portion of the at least one metallic material 418 that is over the dielectric layer 408a by a chemical mechanical polish (CMP) process 449 to form the metallic line 420 in the opening 422, wherein a surface 431 of the TSV structure 430 is substantially leveled with a surface 421 of the metallic line 420 as shown in FIG. 4J. In some embodiments, the surface 431 of the TSV structure 430 is substantially leveled with a surface 411 of the dielectric layer 408a.

Figure 4K:
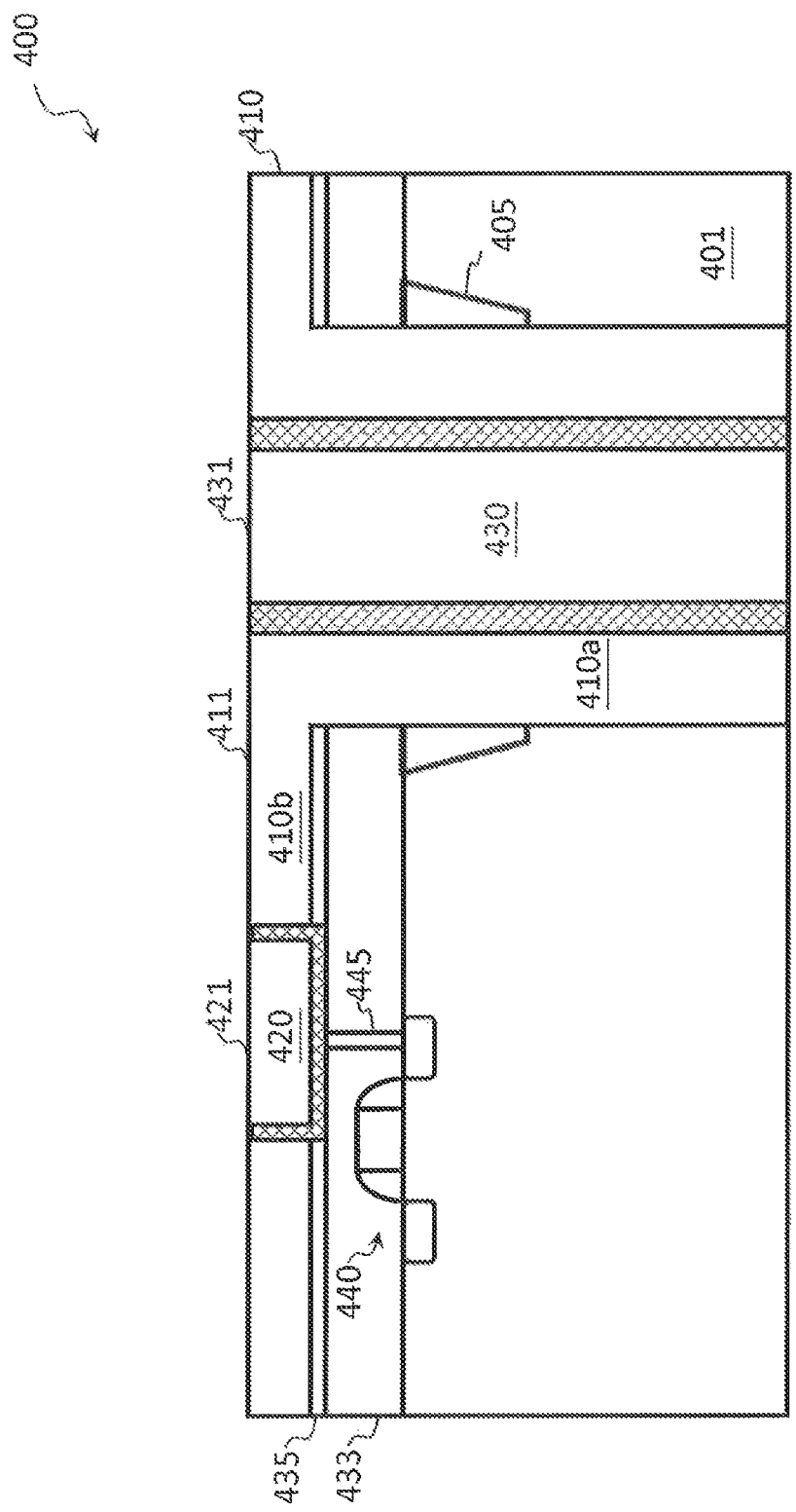

Referring again to FIG. 3, the block 360 includes removing portions of the substrate and the dielectric layer. For example, bottom portions of the substrate 401 and the dielectric layer 408a are removed such that the dielectric layer 410 is formed over the substrate 401 and around the TSV structure 430 as shown in FIG. 4K. By removing the bottom portions of the substrate 401 and the dielectric layer 408a, the TSV structure 430 is formed, continuously extending through the substrate 401 and the dielectric layer 410.

As shown in FIG. 4K, the dielectric layer 410 can include portions 410a and 410b. The portion 410a can be disposed between the substrate 401 and the TSV structure 430. The portion 410b can be disposed over the substrate 401. In some embodiments, the portion 410a is thicker than the portion 410b.

As noted, the dielectric layer 408 is formed as a liner layer continuously extending over the substrate and along the sidewalls of the TSV opening 415 as shown in FIG. 4C. The portion of the dielectric layer 408 that is over the etch stop layer 435 is used as a IMD layer in which the metallic line 420 is formed.

In at least one embodiment, a semiconductor structure includes a dielectric layer disposed over a substrate. A metallic line is disposed in the dielectric layer. A through-silicon-via (TSV) structure continuously extends through the dielectric layer and the substrate. A surface of the metallic line is substantially leveled with a surface of the TSV structure.

In at least one embodiment, a method of forming a semiconductor structure includes forming a through-silicon-via (TSV) opening in a substrate. A dielectric layer is formed, continuously extending over the substrate and into the TSV opening. At least one conductive material is formed over the dielectric layer and in the TSV opening. A portion of the at least one conductive material that is over the dielectric layer is removed to form a TSV structure in the substrate. A metallic line is formed in the dielectric layer. A portion of the substrate is removed, such that the TSV structure continuously extends through the substrate and the dielectric layer.

In at least one embodiment, a method of forming a semiconductor structure includes forming a through-silicon-via (TSV) opening in a substrate. A dielectric layer is formed to continuously extend over the substrate and into the TSV opening. At least one conductive material is formed over the dielectric layer. The at least one conductive material is formed both outside and in the TSV opening. A first portion of the at least one conductive material outside the TSV opening is removed, while leaving a second portion of the at least one conductive material in the TSV opening to form a TSV structure in the substrate. The removal of the first portion of the at least one conductive material comprises removing a partial thickness of a first portion of the dielectric layer underlying the first portion of the at least one conductive material.

In at least one embodiment, a method of forming a semiconductor structure includes forming a semiconductor device over a substrate. A dielectric layer is formed over the substrate. The semiconductor device is embedded in the dielectric layer. A through-silicon-via (TSV) opening is formed to continuously extend through the dielectric layer and into the substrate. A liner layer is formed to continuously extend over the dielectric layer and into the TSV opening. At least one conductive material is formed over the liner layer and in the TSV opening. A portion of the at least one conductive material outside the TSV opening is removed, while leaving a further portion of the at least one conductive material in the TSV opening to form a TSV structure in the substrate. A metallic line is formed in the liner layer outside the TSV opening. A portion of the substrate is removed, such that the TSV structure continuously extends through the substrate, the dielectric layer and the liner layer. A first portion of the liner layer that is over the substrate has a first thickness measured in a thickness direction of the substrate. A second portion of the liner layer that is interposed between the TSV structure and the substrate has a second thickness measured in a direction perpendicular to the thickness direction of the substrate. The second thickness is greater than the first thickness.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor structure, the method comprising:
    forming a through-silicon-via (TSV) opening in a substrate;
    forming a dielectric layer continuously extending over the substrate and into the TSV opening;
    forming at least one conductive material over the dielectric layer and in the TSV opening;
    removing a portion of the at least one conductive material that is over the dielectric layer to form a TSV structure in the substrate;
    forming a metallic line in the dielectric layer, wherein an upper surface of the metallic line is level with an upper surface of the TSV structure; and
    removing a portion of the substrate, such that the TSV structure continuously extends through the substrate and the dielectric layer.

2. The method of claim 1, wherein forming the metallic line comprises:
    forming a cap layer over the dielectric layer;
    forming a patterned mask layer over the cap layer, the patterned mask layer covering the TSV structure and exposing a portion of the cap layer;
    removing the exposed portion of the cap layer and a portion of the dielectric layer by using the patterned mask layer as an etch mask to form an opening in the dielectric layer;
    removing the patterned mask layer; and
    forming the metallic line in the opening in the dielectric layer.

3. The method of claim 2, wherein forming the metallic line in the opening in the dielectric layer comprises
    forming at least one metallic material over the cap layer and in the opening in the dielectric layer; and
    removing a portion of the at least one metallic material that is over the dielectric layer by a chemical mechanical polish (CMP) process to form the metallic line in the opening in the dielectric layer.

4. The method of claim 2, wherein the cap layer protects the TSV structure from being oxidized by the patterned mask layer.

5. The method of claim 1, further comprising:
    forming at least one transistor over the substrate; and
    forming at least one contact plug that is electrically coupled between the metallic line and the at least one transistor, wherein an upper surface of the dielectric layer is leveled with the upper surface of the TSV structure.

6. The method of claim 5, wherein the TSV structure is formed without having an interface at a region that is leveled with an interface between the at least one contact plug and the metallic line.

7. A method of forming a semiconductor structure, the method comprising:
    forming a through-silicon-via (TSV) opening in a substrate;
    forming a dielectric layer continuously extending over the substrate and into the TSV opening;
    forming at least one conductive material over the dielectric layer, the at least one conductive material formed both outside and in the TSV opening;
    removing a first portion of the at least one conductive material outside the TSV opening, while leaving a second portion of the at least one conductive material in the TSV opening to form a TSV structure in the substrate, wherein removing the first portion of the at least one conductive material comprises removing a partial thickness of a first portion of the dielectric layer underlying the first portion of the at least one conductive material; and
    forming a metallic line in the first portion of the dielectric layer after removing the partial thickness of the first portion of the dielectric layer, wherein an upper surface of the metallic line is level with an upper surface of the TSV structure and level with an upper surface of the dielectric layer.

8. The method of claim 7, wherein
    after removing the partial thickness of the first portion of the dielectric layer, the first portion of the dielectric layer has a first thickness measured in a thickness direction of the substrate;
    the dielectric layer further has a second portion interposed between the TSV structure and the substrate has a second thickness measured in a direction perpendicular to the thickness direction of the substrate, and
    the second thickness is greater than the first thickness.

9. The method of claim 7, further comprising:
    removing a portion of the substrate, such that the TSV structure continuously extends through the substrate and the dielectric layer.

10. The method of claim 7, wherein forming the metallic line comprises:
    forming a cap layer over the dielectric layer;
    forming a patterned mask layer over the cap layer, the patterned mask layer covering the TSV structure and exposing a portion of the cap layer;
    removing the exposed portion of the cap layer and a part of the first portion of the dielectric layer by using the patterned mask layer as an etch mask to form an opening in the first portion of the dielectric layer;
    removing the patterned mask layer; and
    forming the metallic line in the opening.

11. The method of claim 10, wherein the cap layer protects the TSV structure from being oxidized by the patterned mask layer.

12. The method of claim 7, wherein forming the metallic line comprises:
    forming an opening in the first portion of the dielectric layer;
    forming at least one metallic material over the dielectric layer and in the opening; and
    removing a portion of the at least one metallic material outside the opening to form the metallic line with the upper surface which is leveled with the upper surface of the TSV structure and leveled with the upper surface of the dielectric layer.

13. The method of claim 12, further comprising:
    forming at least one transistor over the substrate; and
    forming at least one contact plug that is electrically coupled between the metallic line and the at least one transistor.

14. A method of forming a semiconductor structure, the method comprising:
- forming a semiconductor device over a substrate;
- forming a dielectric layer over the substrate, the semiconductor device embedded in the dielectric layer;
- forming a through-silicon-via (TSV) opening continuously extending through the dielectric layer and into the substrate;
- forming a liner layer continuously extending over the dielectric layer and into the TSV opening;
- forming at least one conductive material over the liner layer and in the TSV opening;
- removing a portion of the at least one conductive material outside the TSV opening, while leaving a further portion of the at least one conductive material in the TSV opening to form a TSV structure in the substrate;
- forming a metallic line in the liner layer outside the TSV opening; and
- removing a portion of the substrate, such that the TSV structure continuously extends through the substrate, the dielectric layer and the liner layer, wherein
- a first portion of the liner layer that is over the substrate has a first thickness measured in a thickness direction of the substrate,
- a second portion of the liner layer that is interposed between the TSV structure and the substrate has a second thickness measured in a direction perpendicular to the thickness direction of the substrate,
- the second thickness is greater than the first thickness, and
- forming the metallic line comprises forming the metallic line in the first portion of the liner layer such that the metallic line has an upper surface leveled with an upper surface of the TSV structure and leveled with an upper surface of the first portion of the liner layer.

15. The method of claim 14, wherein forming the metallic line comprises forming the metallic line with an entire thickness embedded in the first portion of the liner layer.

16. The method of claim 14, further comprising:
- forming at least one contact plug in the dielectric layer and electrically coupled between the metallic line and the semiconductor device.

17. The method of claim 16, wherein the TSV structure is continuous at a region that is leveled with an interface between the at least one contact plug and the metallic line.

* * * * *